(12) United States Patent
Fukuzawa et al.

(10) Patent No.: US 7,808,330 B2
(45) Date of Patent: *Oct. 5, 2010

(54) HIGH-FREQUENCY OSCILLATOR

(75) Inventors: Hideaki Fukuzawa, Kawasaki (JP);
Hiromi Yuasa, Kawasaki (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 221 days.

This patent is subject to a terminal disclaimer.

(21) Appl. No.: 12/027,650

(22) Filed: Feb. 7, 2008

(65) Prior Publication Data

US 2008/0129401 A1    Jun. 5, 2008

Related U.S. Application Data

(62) Division of application No. 11/524,238, filed on Sep. 21, 2006, now Pat. No. 7,504,898.

(30) Foreign Application Priority Data

Oct. 28, 2005 (JP) .............................. 2005-314689

(51) Int. Cl.
*H01L 29/82* (2006.01)
*B32B 7/02* (2006.01)

(52) U.S. Cl. .................... 331/96; 428/212; 257/421; 324/237; 331/187

(58) Field of Classification Search ............. 331/96, 331/187
See application file for complete search history.

(56) References Cited

U.S. PATENT DOCUMENTS 5,695,864 A    12/1997   Slonczewski 7,126,202 B2 * 10/2006 Huai et al. .................. 257/421

FOREIGN PATENT DOCUMENTS

| JP | 2002-208744 | 7/2002 |
| JP | 2004-349966 | 12/2004 |
| JP | 2005-19570 | 1/2005 |
| JP | 2005-109499 | 4/2005 |
| JP | 2005-285936 | 10/2005 |

OTHER PUBLICATIONS

Kiselev, S. I. et al., "Microwave Oscillations of a Nanomagnet Driven by a Spin-Polarized Current," Nature, vol. 425, pp. 380-383, (Sep. 25, 2003).
Slonczewski, J. C., "Current-Driven Excitation of Magnetic Multilayers," Journal of Magnetism and Magnetic Materials, vol. 159, pp. L1-L7, (1996).
Notice of Reasons for Rejection issued by the Japanese Patent Office in Japanese Patent Application No. 2005-314689, mailed Feb. 23, 2010.

* cited by examiner

*Primary Examiner*—Joseph Chang
(74) *Attorney, Agent, or Firm*—Finnegan, Henderson, Farabow, Garrett & Dunner, L.L.P.

(57) ABSTRACT

A high-frequency oscillator includes a high-frequency oscillation element having a magnetization pinned layer whose magnetization direction is pinned substantially in one direction, an oscillation layer formed of a magnetic material which generates a high-frequency oscillation phenomenon when a current is supplied, an intermediate layer provided between the magnetization pinned layer and the oscillation layer, the intermediate layer having an insulation layer and current paths which pass through the insulation layer in a thickness direction, and a pair of electrodes which supply a current perpendicularly to a plane of a stacked film including the magnetization pinned layer, the intermediate layer and the oscillation layer.

7 Claims, 12 Drawing Sheets

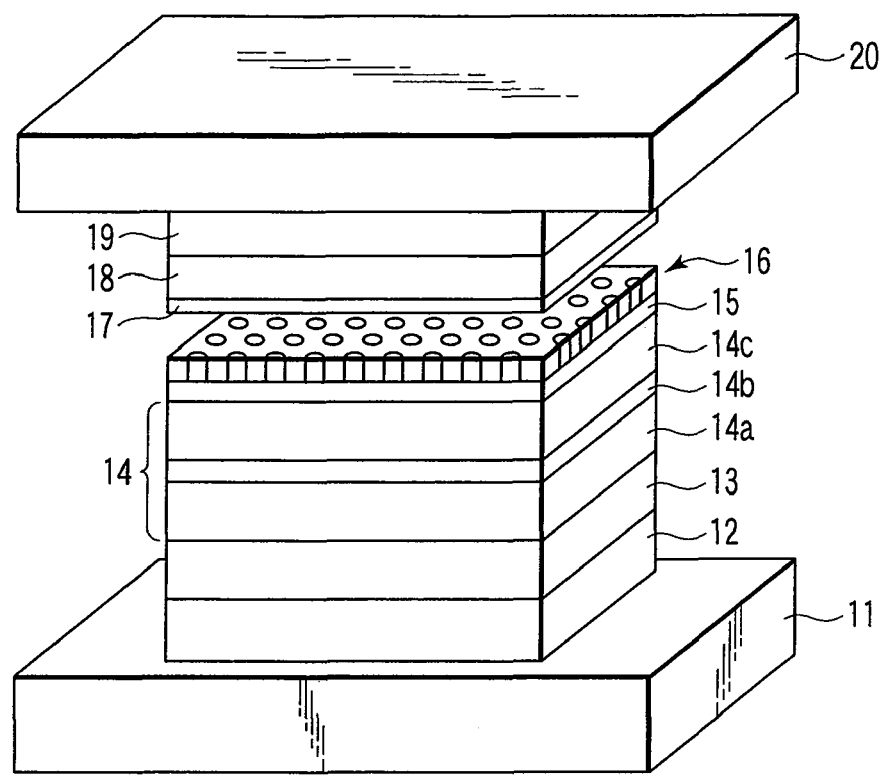
F I G. 1
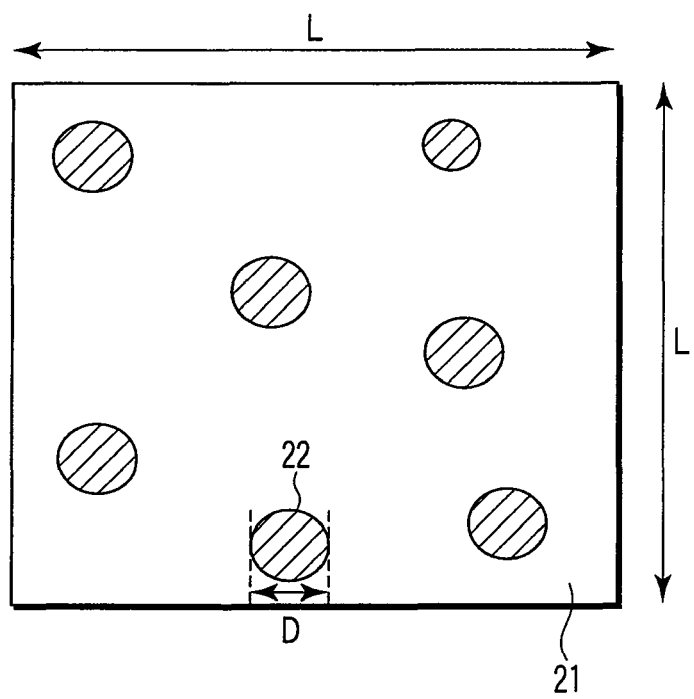
F I G. 2

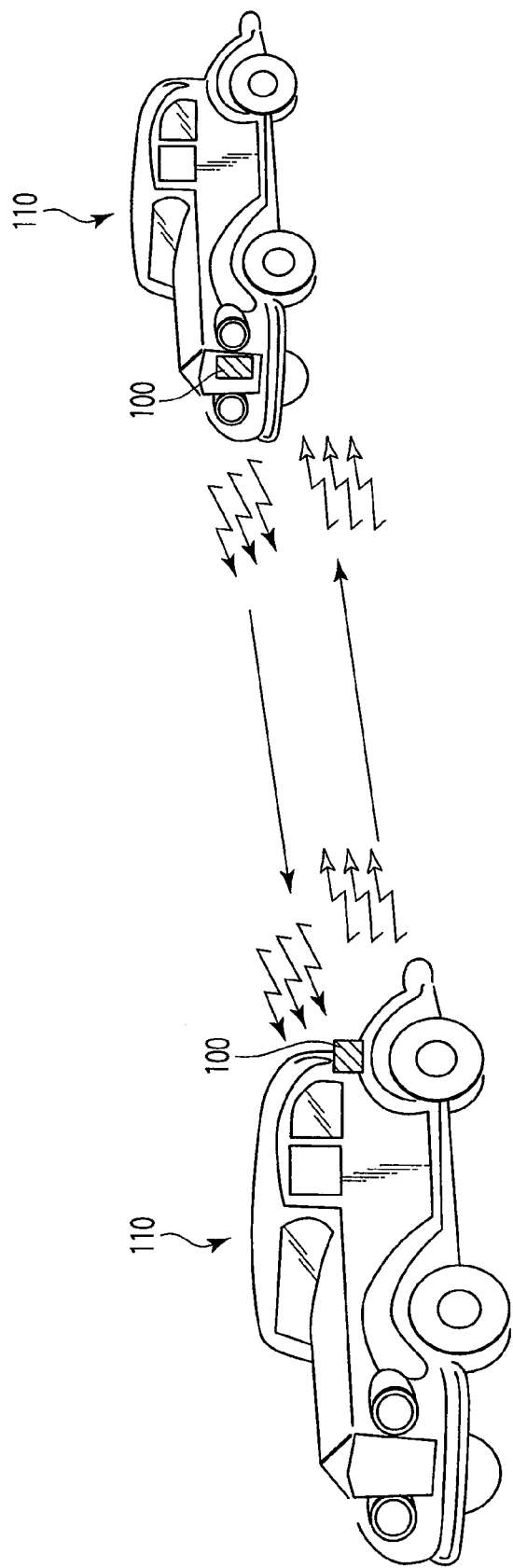
F I G. 21
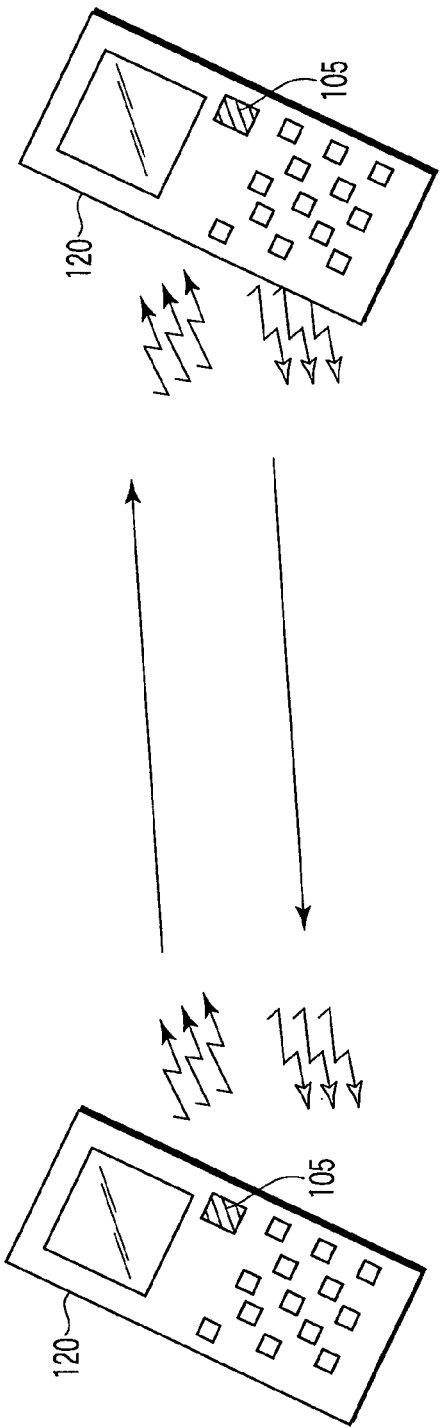
F I G. 22

HIGH-FREQUENCY OSCILLATOR

CROSS-REFERENCE TO RELATED APPLICATIONS

This is a division of application Ser. No. 11/524,238, filed Sept. 21, 2006, now U.S. Pat. No. 7,504,898 the entire contents of which are incorporated herein by reference.

This application is based upon and claims the benefit of priority from prior Japanese Patent Application No. 2005-314689, filed Oct. 28, 2005, the entire contents of which are incorporated herein by reference.

BACKGROUND OF THE INVENTION

1. Field of the Invention

The present invention relates to a high-frequency oscillator for use in a millimeter-wave-band or microwave-band radio communication apparatus, radar device and the like.

2. Description of the Related Art

In the case where millimeter wave band or microwave band is used for communication or radar applications, it is unlikely to be subject to influences of weather or powder dust. Because it is of short wavelength, a transmitting/receiving antenna can be made compact. In addition, it enables to detect the relative speed to an object through the Doppler effect with high precision. For these reasons, in recent years, millimeter-wave radar has been started to be installed in vehicles to prevent vehicle collisions due to carelessness or misjudgment of drivers.

A conventional millimeter-wave oscillator includes a semiconductor device such as a Gunn diode. In such a millimeter-wave oscillator including a semiconductor device, the temperature of the semiconductor device becomes high when driven, and the oscillation characteristics change. For this reason, it is necessary to devise a structure so as to suppress the temperature increase at driving. However, such a millimeter-wave oscillator must have a complicated structure (see, for example, JP-A-2005-19570), which has been a problem.

On the other hand, in a communication device for communicating information via radio or wire, a high-frequency filter having a function to take out only a desired frequency band is built in as its major component. In order to use frequency effectively to operate a communication device with saved energy, the high-frequency filter is required to be excellent in attenuation characteristics and to have a small insertion loss. To realize the requirement, a resonant element of a high Q value is needed. As a high-frequency filter showing a high Q value, there is known a filter using a superconductive element (see, for example, JP-A-2004-349966). However, in order to operate a superconductive element, the element must be cooled by use of liquid nitrogen or liquid helium. As a consequence, it is difficult to realize a compact high-frequency filter, and it is also difficult to apply a superconductive element to consumer products from the viewpoint of cost.

In contrast to these conventional oscillators, an oscillator employing a quite different physical principle has been proposed. See, for example, S. I. Kiselev et al., Nature, 425, 308 (2003). This oscillator has a stacked film including a magnetic layer, a nonmagnetic metal layer and a magnetic layer, and a pair of electrodes for allowing current to flow perpendicularly to the plane of the stacked film. An oscillation phenomenon is generated when a current is supplied. Hereinafter, this oscillator is referred to as a current-perpendicular-to-plane (CPP) oscillator. With regard to the CPP oscillator, not only applications as an oscillator, but also other applications to a high-frequency filter element and the like are now under discussions (see U.S. Pat. No. 5,695,864).

In this CPP oscillator, the element size of 100 nm×100 nm or less is required from its physical principle. Such an ultrafine oscillator using not a semiconductor but a metal is expected to have advantages including excellent heat dissipation, small heat generation, and small temperature characteristics of oscillation characteristics. Further, if such a circuit is used, it is not necessary to construct a complicated structure as in the conventional technique for attaining an oscillation phenomenon. The CPP oscillator has a unique characteristic in principle of operation that an oscillation phenomenon is attained only by flowing direct current to the device. Accordingly, it has an expected advantage that in forming a high-frequency oscillator, the circuit thereof can be simplified.

However, in a normal CPP oscillator, it is difficult to obtain operations as a practical device, and at present, there is no development on devices for practical use. This is because an output of oscillation signals is extremely low, and when the amount of current is increased to make high the output of oscillation signals, magnetization reversal of the magnetic layer occurs due to a spin transfer torque phenomenon. See, for example, J. C. Slonczewski, J. Magn. Magn. Mater., 159, L1 (1996). Once the magnetization reversal occurs, oscillation conditions change, and stable oscillation operations cannot be maintained, and as a result, it cannot be used as a device. In addition, it is not easy to change oscillation frequencies in a normal CPP oscillator, and its operating frequency waveband is limited, which has been another problem.

BRIEF SUMMARY OF THE INVENTION

A high-frequency oscillator according to an aspect of the present invention comprises: a high-frequency oscillation element comprising a magnetization pinned layer whose magnetization direction is pinned substantially in one direction; an oscillation layer formed of a magnetic material which generates a high-frequency oscillation phenomenon when a current is supplied; an intermediate layer provided between the magnetization pinned layer and the oscillation layer, the intermediate layer comprising an insulation layer and current paths which pass through the insulation layer in a thickness direction; and a pair of electrodes which supply a current perpendicularly to a plane of a stacked film including the magnetization pinned layer, the intermediate layer and the oscillation layer.

BRIEF DESCRIPTION OF THE SEVERAL VIEWS OF THE DRAWING

FIG. 1 is a perspective view of a high-frequency oscillator according to an embodiment;

FIG. 2 is a schematic view showing a cross section of an intermediate layer in FIG. 1 sectioned parallel to the plane;

FIG. 21 is a view showing a vehicle-to-vehicle communication apparatus according to Embodiment 7; and FIG. 22 is an information terminal-to-terminal communication apparatus according to Embodiment 8.

DETAILED DESCRIPTION OF THE INVENTION

Figure 3:
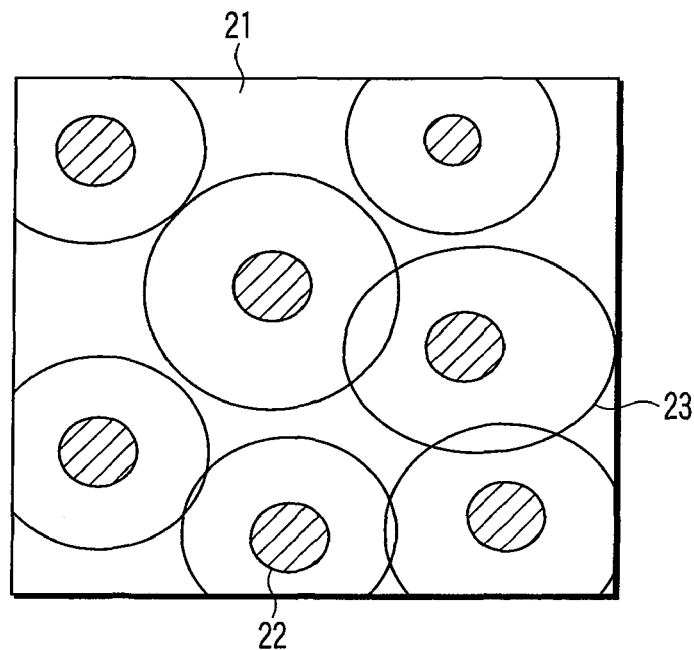
FIG. 3 is a schematic view showing regions where spin wave excitation occurs efficiently in an oscillation layer of a CCP-CPP oscillator according to an embodiment.

FIG. 1 shows a perspective view of a high-frequency oscillator comprising a high-frequency oscillation element according to an embodiment of the present invention. The high-frequency oscillation element constituting the high-frequency oscillator has a structure in which stacked on a substrate (not shown) are a lower electrode 11, an underlayer 12, a pinning layer 13, a magnetization pinned layer (pinned layer) 14 including a lower pinned layer 14a, an Ru layer 14b and an upper pinned layer 14c, a metal layer 15, an intermediate layer (spacer layer) 16, a metal layer 17, an oscillation layer 18, a cap layer 19, and an upper electrode 20. The intermediate layer 16 includes an insulation layer 21, and current paths 22 made of a metal in nanometer order which pass through the insulation layer in the thickness direction. When a current is made to flow perpendicularly to the plane of the stacked film of the magnetization pinned layer 14, the intermediate layer 15 and the oscillation layer 18 between the lower electrode 11 and the upper electrode 20, the current flows confined in the current paths 22 of the intermediate layer 16. Consequently, spin wave excitation (precession of magnetization) of the oscillation layer 18 occurs due to spin transfer torque, and high-frequency oscillation of a certain frequency is obtained. Because of such an effect, we named this oscillator as a current-confined-path CPP (CCP-CPP) oscillator.

FIG. 2 shows a schematic view of a cross section of the intermediate layer in FIG. 1 sectioned parallel to the plane. As the element size that can cause efficient oscillation, a length L of one side is 20 to 200 nm, and typically 40 to 100 nm. The size D of the current path is 0.5 to 10 nm, and typically 1 to 6 nm. It should be noted that, although the device shape is illustrated as a rectangular in FIG. 2, a circular shape or an oval shape may be employed as long as it is of the same device size as the above.

In accordance with the CCP-CPP oscillator according to the embodiment of the invention, the following two effects are attained.

(1) In the CCP-CPP oscillator, current is confined by the current paths in the intermediate layer, and the local current density shows an extremely high value. The high current density generates oscillation efficiently, and the area where the current density is highly localized brings about an advantage that magnetization reversal is unlikely to occur. Hereinafter, in comparison with a normal CPP oscillator, the effects of the CCP-CPP oscillator according to the embodiment of the present invention will be described in more details.

First, description will be given to the reason why oscillation occurs more efficiently in the CCP-CPP oscillator according to the embodiment than a normal CPP oscillator.

The normal CPP oscillator is designed into a device size of 100 nm×100 nm or less. For example, if a current of 1 mA is made to flow into a CPP oscillator of 100 nm×100 nm evenly on its entire plane, the current density becomes 1 mA/(100 nm×100 nm)=1×10$^7$ A/cm$^2$. At the current density at this level, spin wave excitation due to spin transfer torque occurs, and high-frequency oscillation of millimeter wave or microwave band occurs. Because spin wave excitation can occur more efficiently as the current density is larger, it is advantageous for oscillation. However, when the current of a high current density is supplied to the entire plane, the other phenomenon due to spin transfer torque, that is, magnetization reversal occurs. In other words, the magnetization of either the magnetization pinned layer or the oscillation layer becomes reversed. Once magnetization reversal occurs, the relative magnetization alignment of the magnetization pinned layer and the oscillation layer changes, and thus, the spin wave excitation is also influenced. As a result, the change in oscillation frequencies and the change in Q values occur, which is not preferable as an oscillator.

Now, as one example of the CCP-CPP oscillator according to the present invention, suppose one in which an area ratio of nanoscopic current paths in the plane is 10%. If a current of 1 mA is made to flow into a CCP-CPP oscillator of 100 nm×100 nm, the current density becomes 1×10$^7$ A/cm$^2$/(10%)=1×10$^8$ A/cm$^2$. It is preferable to use the current density of 10$^8$ A/cm$^2$ or more locally in the CCP-CPP oscillator according to the embodiment. In this manner, in the CCP-CPP oscillator according to the embodiment, a high current density is obtained depending on the area ratio of current paths, and local spin wave excitation occurs efficiently. Accordingly, a high oscillation output is obtained, and the Q value becomes high as well. Further, in the use as a high-frequency filter, the sensitivity becomes preferable. In order to exert the effect of the embodiment, the area ratio of nanoscopic current paths in the plane of the intermediate layer is set 1% to 95%, typically 2% to 90%, and more typically 3% to 50%.

Next, description will be given to the reason why the other phenomenon due to spin transfer torque, that is, magnetization reversal is unlikely to occur in the CCP-CPP oscillator according to the embodiment. When spin transfer torque is used for a magnetic random access memory (MRAM) application, it becomes important in practice how to generate magnetization reversal at a low current density. Moreover, in the MRAM application, since an energetically stable state can be obtained after the magnetization reversal is caused by a current supply, it is general to take such a measure that further magnetization dynamics does not occur. In contrast, because an energetically stable state is attained and magnetization dynamics is terminated in the oscillator when magnetization reversal is caused in a magnetic layer in the oscillator, above measure is meaningless. Therefore, as described previously, it is desired that stable precession is caused under as a high current density as possible.

FIG. 3 schematically shows regions where spin wave excitation occurs efficiently in the oscillation layer of the CCP-CPP oscillator according to the embodiment. As shown in FIG. 3, a current is confined by nanoscopic current paths in the intermediate layer, and in the adjacent oscillation layer, current flows in regions 23 widened a little than the area of the nanoscopic current paths 22. In the regions 23, spin wave excitation occurs efficiently. The regions 23 where spin wave excitation occurs efficiently do not completely correspond to the regions where the current widens in the oscillation layer. Since spins are exchange-coupled in the oscillation layer, the regions 23 where spin wave excitation occurs efficiently are somewhat wider than the regions where the current density is high. However, unlike the normal CPP oscillator, the regions 23 where spin wave excitation occurs efficiently do not become the entire surface of the magnetic layer, and thus, magnetization reversal of the entire magnetic layer is unlikely to occur. This is because the entire surface must be spin-wave excited in order for magnetization reversal to occur in the magnetic layer by spin transfer torque. In the state where the entire device is not spin-wave excited evenly as shown in FIG. 3, magnetization reversal phenomenon is unlikely to occur. Namely, a device operation with stable oscillation conditions becomes available.

As described above, according to the CCP-CPP oscillator of the invention, it is possible to generate oscillation efficiently by locally high current density, and magnetization reversal is unlikely to occur because regions with high current density are localized, so that it is possible to attain both output and operation stability.

(2) In the CCP-CPP oscillator according to the embodiment, oscillation frequencies can be changed by changing the area ratios of nanoscopic current paths in the plane. By using this fact, CCP-CPP oscillators with different area ratios of nanoscopic current paths are used to obtain various oscillation frequencies with low power consumption. Specifically, a high-frequency integrated circuit is manufactured by forming a plurality of CCP-CPP oscillators with different area ratios of nanoscopic current paths on the same substrate with a small chip size. This makes it possible to obtain oscillation frequencies with extremely wide frequency band. Further, it may be also used as a high-frequency filter capable of selecting frequencies with extremely wide band. In the conventional high-frequency device technology, it is impossible to realize such a high-frequency integrated circuit. Devices to handle millimeter waves and microwaves, having complicated structures and high prices, have not been used widely. However, according to the CCP-CPP oscillator under the invention, it is possible to realize the spread use of consumer products handling millimeter waves and microwaves.

Figure 4:
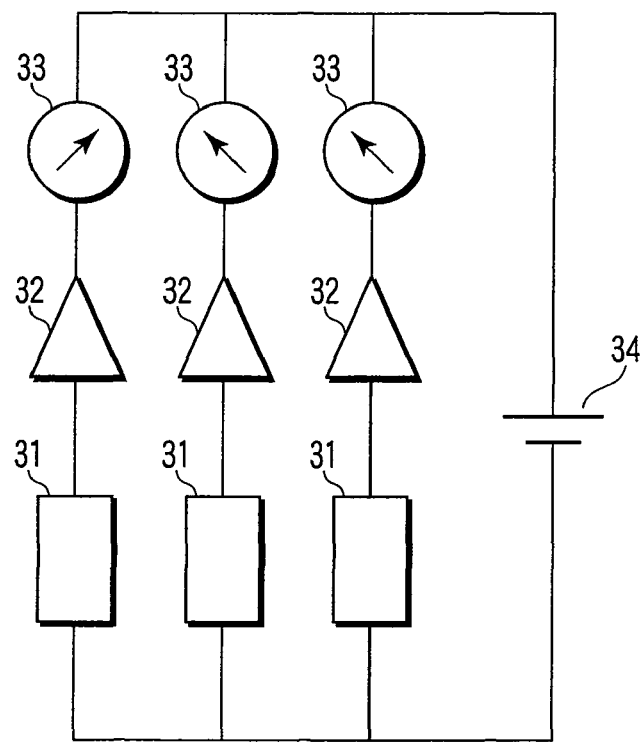
FIG. 4 is a diagram showing an example of a high-frequency integrated circuit according to an embodiment.

In an example of a high-frequency integrated circuit according to an embodiment of the present invention shown in FIG. 4, three systems of series circuits each including a CCP-CPP oscillator 31, an amplifier 32, and ammeter 33 are connected in parallel to a power source 34 by which a high-frequency integrated circuit is configured. The respective CCP-CPP oscillators 31 have different area ratios of nanoscopic current paths in the intermediate layer, and different oscillation frequencies. In the high-frequency integrated circuit, an extremely wide frequency band can be obtained by controlling the selection of the CCP-CPP oscillators 31 to which a current is supplied.

In another embodiment of the present invention, a plurality of CCP-CPP oscillators may be electrically connected in series. When CCP-CPP oscillators are connected in series, it is possible to increase the output of oscillation signals.

Even in a normal CPP oscillator, it is effective to connect a plurality of CPP oscillators in series or in parallel as described above, and it is possible to attain the same effect of increased output as in the case of a CCP-CPP oscillator.

Figure 5:
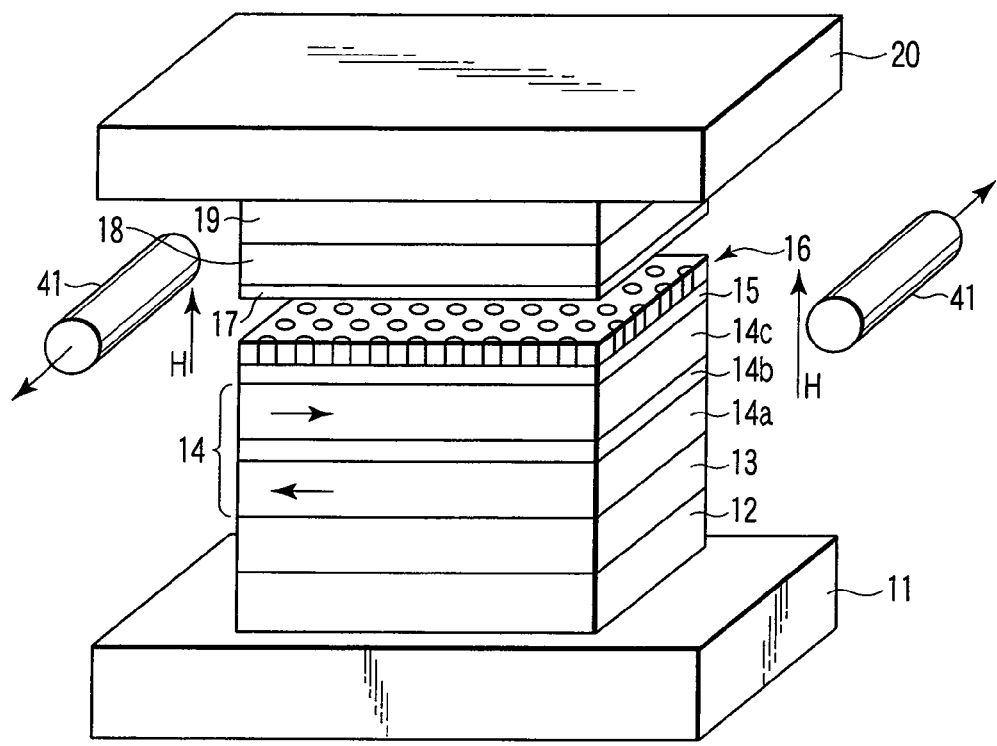
FIG. 5 is a perspective view of a CCP-CPP oscillator having a magnetic field application mechanism according to an embodiment.
Figure 6:
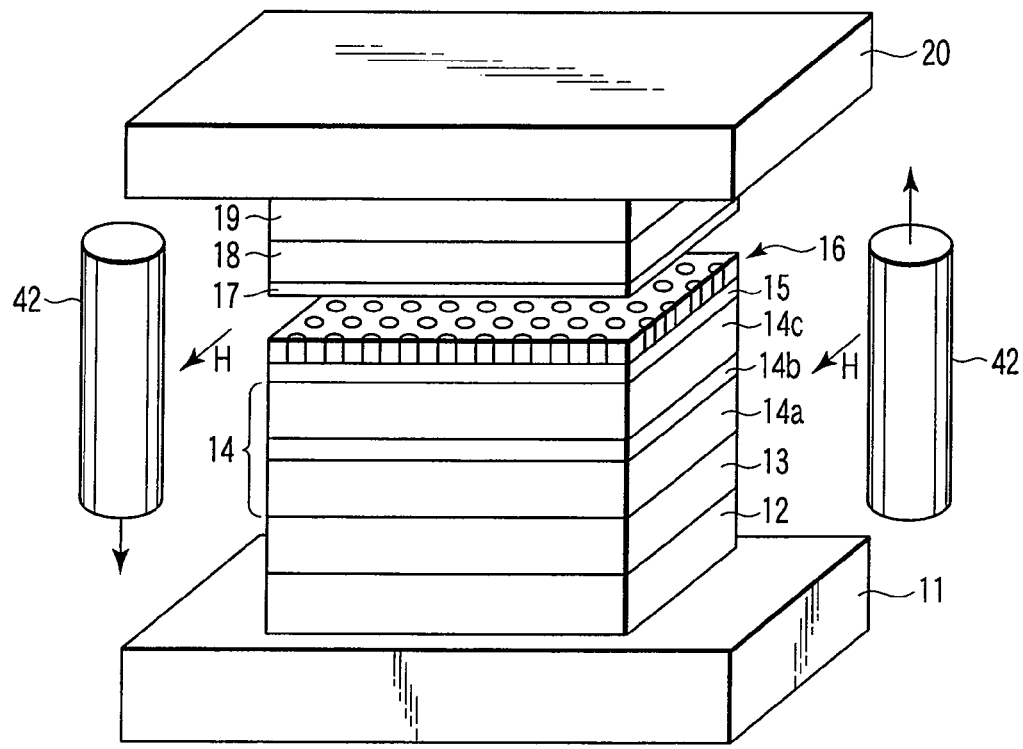
FIG. 6 is a perspective view of a CCP-CPP oscillator having a magnetic field application mechanism according to another embodiment.
Figure 7:
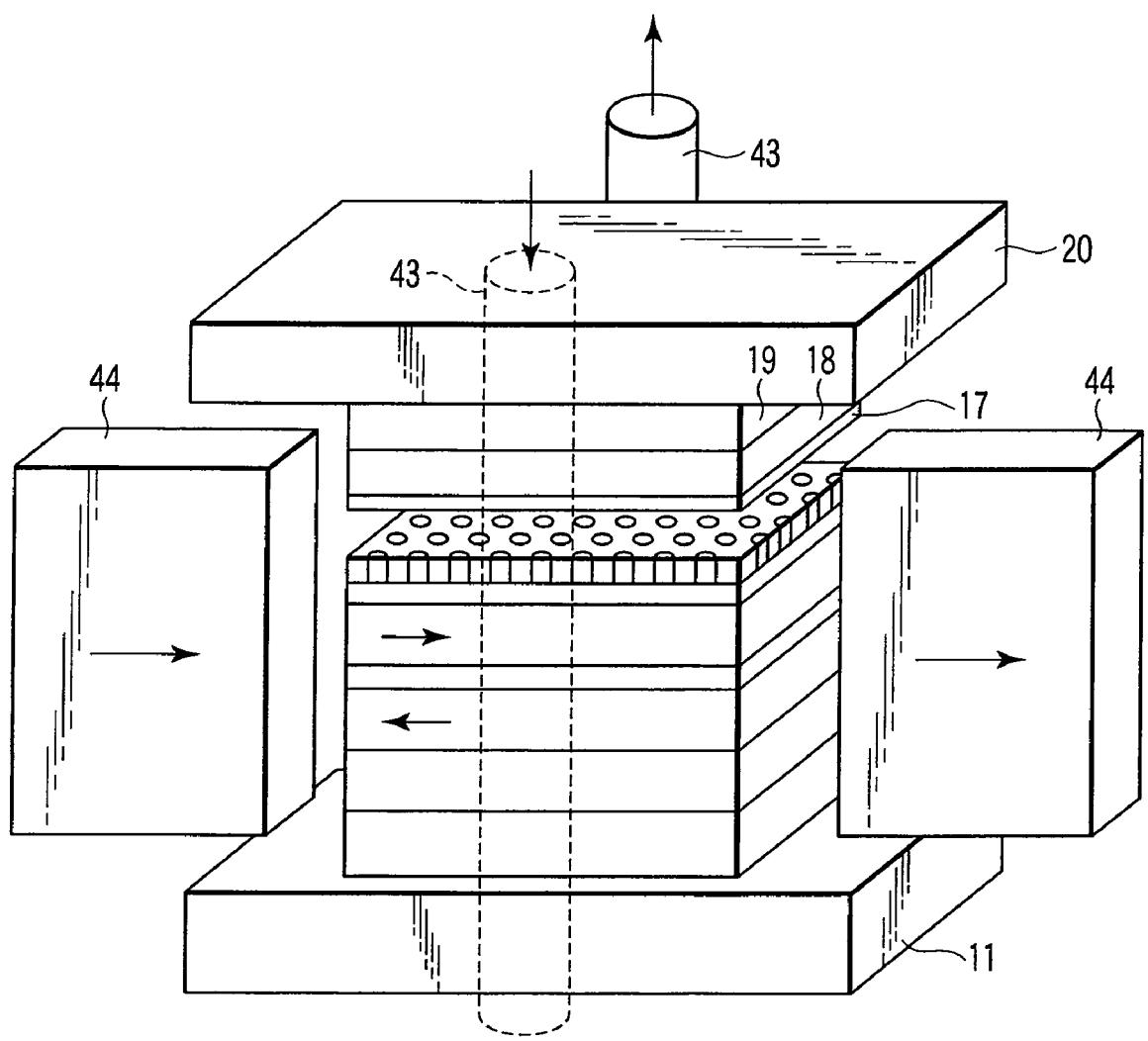
FIG. 7 is a perspective view of a CCP-CPP oscillator having a magnetic field application mechanism according to still another embodiment.

Further, oscillation frequencies can be changed by applying an external magnetic field to a CCP-CPP oscillator. Although the change of oscillation frequencies by this method is small, this method may be used at necessity. With reference to FIGS. 5 to 7, a mechanism for applying an external magnetic field to a CCP-CPP oscillator will be described.

In an example in FIG. 5, a pair of wires 41 is arranged at both sides of a CCP-CPP oscillator so as to be made perpendicular to the direction of current supplied to the CCP-CPP oscillator. In this case, a current is made to flow to the wires 41 so as to apply an external magnetic field in the same direction (upward in FIG. 5) perpendicular to the plane of the CCP-CPP oscillator.

In an example in FIG. 6, a pair of wires 42 is arranged at both sides of a CCP-CPP oscillator so as to become parallel to the direction of current supplied to the CCP-CPP oscillator. In this case, a current is made to flow to the wires 42 so as to apply an external magnetic field in the same direction (toward this side in FIG. 6) parallel to the plane of the CCP-CPP oscillator.

In an example in FIG. 7, a magnetic field application mechanism by wires and a magnetic field application mechanism by a hard bias film are used together. Namely, a pair of wires 43 is arranged at two sides of a CCP-CPP oscillator so as to become parallel to the direction of current supplied to the CCP-CPP oscillator, and hard bias film 44 are arranged on other two sides of the CCP-CPP oscillator. In this case, a current is made to flow to the wires 43 and the hard bias film 44 is set so as to apply an external magnetic field in the same direction (toward the right in FIG. 7) parallel to the plane of the CCP-CPP oscillator.

The arrangement of such magnetic field application mechanisms as shown in FIGS. 5 to 7 is to make it possible to function as a device that operates as a high-frequency oscillator. The structure in which a magnetic field application mechanism as a device is added to change oscillation frequencies is also effective in a normal CPP oscillator, and it is possible to attain the same effect as in the case of a CCP-CPP oscillator.

In the CCP-CPP oscillator according to the embodiment of the invention, oscillation frequencies can also be changed more or less by changing the current amount to be applied. However, since it is difficult to largely change the band of oscillation frequency in this method, the method is applied to the case of performing fine band tuning.

EXAMPLES

Examples of the present invention will be described in more detail with reference to the accompanying drawings hereinafter. In the following examples, symbol "%" representing a composition of an alloy means atomic %.

Embodiment 1

In Example 1, a specific example of a high-frequency oscillator (CCP-CPP element) having the structure shown in FIG. 1 will be described. The high-frequency oscillator of the example is manufactured by stacking the following films sequentially on a substrate (not shown).
Lower electrode 11
Underlayer 12: Ta [5 nm]/Ru [2 nm]
Pinning layer 13: $Pt_{50}Mn_{50}$ [15 nm]
Magnetization pinned layer (pinned layer) 14: $Co_{90}Fe_{10}$ [3.6 nm]/Ru [0.9 nm]/$Fe_{50}Co_{50}$ [3 nm]
Metal layer 15: Cu [0.5 nm]
Spacer layer 16: $Al_2O_3$ insulation layer 21 and Cu current paths 22 (which is formed by a method of depositing a film of $Al_{90}Cu_{10}$ [1 nm], performing a pre-ion treatment before oxidization to apply ion beam of rare gas [PIT] and ion beam-assisted oxidization [IAO])
Metal layer 17: Cu [0.25 nm]
Magnetic oscillation layer 18: $Co_{90}Fe_{10}$ [1 nm]/$Ni_{83}Fe_{17}$ [3.5 nm]
Cap layer 19: Cu [1 nm]/Ru [10 nm]
Upper electrode 20

It should be noted that the spacer layer 16, the upper and lower metal layers 15 and 17 may be entirely referred to as a spacer layer hereinafter. The CCP-CPP oscillator in FIG. 1 is a bottom type in which the pinned layer 14 is arranged on the bottom, but it is needless to say that it may be a top type in which the pinned layer 14 is arranged on the top. Hereinafter, a method for manufacturing the CCP-CPP device in FIG. 1 will be described in more detail.

On a substrate (not shown), a lower electrode 11 for allowing a current to flow perpendicularly to the film plane is formed. On the lower electrode 11, a film of Ta [5 nm]/Ru [2 nm] is deposited as an underlayer 12. Ta is a buffer layer for buffering the roughness of the lower electrode. Ru is a seed layer for controlling crystal orientation and crystal grain size of a spin valve film to be deposited thereon.

As the buffer layer, Ta, Ti, W, Zr, Hf, Cr or their alloy may be employed. The thickness of the buffer layer is preferably 2 to 10 nm, and more preferably 3 to 5 nm. If the thickness of the buffer layer is too small, a buffer effect is lost. If the thickness of the buffer layer is too large, series resistance that does not contribute to an MR ratio is increased, which is not preferable. However, if the seed layer deposited on the buffer layer has the buffer effect as well, it is not always required to provide the buffer layer made of Ta or the like.

As the seed layer, any material that can control the crystal orientation of a layer deposited thereon may be employed, and a metal layer having an hcp structure or an fcc structure or the like is preferable. By using Ru as the seed layer, it is possible to make the crystal orientation of the spin valve film on the seed layer an fcc (111) orientation, and to well maintain an ordered fct structure for the crystal orientation of PtMn, and a bcc (110) orientation for the crystal orientation of a bcc metal. Further, provision of the seed layer enables controlling the crystal grain size of the spin valve film to 10 to 40 nm, so that efficient oscillation can be realized without causing uneven characteristics even if the size of the CCP-CPP oscillator becomes small. With regard to the crystal orientation, it is possible to realize relatively preferable orientation where the full width at half maximum of a rocking curve for an fcc (111) peak of the spin valve film, or an fct (111) peak of PtMn or a bcc (110) peak becomes 3.5 to 6 degrees in measurement by X-ray diffraction. The dispersion angle of the orientation can be also determined from diffraction spot using cross-sectional TEM.

As the seed layer, for example, $Ni_xFe_{100-x}$ (x is 10 to 50%, preferably 15 to 25%), $(Ni_xFe_{100-x})_{100-y}X_y$ (X is selected from Cr, V, Nb, Hf, Zr, Mo) which is made nonmagnetic by adding a third element to NiFe, or the like may be also used in place of Ru. The crystal orientation is more improved in an NiFe-based seed layer than in an Ru-based seed layer, and the full width at half maximum of the rocking curve measured in the same manner as the above becomes 3 to 5 degrees. In order to attain the above-described appropriate crystal grain size of 10 to 40 nm, it is preferable to set the composition y of the third element X to around 0 to 30%. In order to make the crystal grain size more than 40 nm, it is preferable to use a larger amount of the additional element. For example, in the case of NiFeCr, it is preferable to make the amount of Cr around 35 to 45%, and use a composition showing the boundary phase between fcc and bcc.

The thickness of the seed layer is preferably 1.5 to 6 nm, and more preferably 2 to 4 nm. If the thickness of the seed layer is too small, effects of crystal orientation control and the like are lost. If the thickness of the seed layer is too large, the series resistance is increased, and also interfacial roughness of the spin valve film may be resulted.

A pinning layer 13 is deposited on the underlayer 12. The pinning layer 13 has a function of providing unidirectional anisotropy to a ferromagnetic layer as a pinned layer 14 to be deposited thereon to pin magnetization thereof. As the material of the pinning layer 13, antiferromagnetic materials such as PtMn, PdPtMn, IrMn, and RuRhMn may be employed. In order to provide sufficiently intense unidirectional anisotropy, the thickness of the pinning layer 13 should be appropriately set. In the case of using PtMn or PdPtMn, the thickness is preferably around 8 to 20 nm, and more preferably 10 to 15 nm. In the case of using IrMn or RuRhMn, unidirectional anisotropy can be provided even by a thinner thickness than that of PtMn or the like, and thus, the thickness is preferably 5 to 18 nm, and more preferably 7 to 15 nm. In place of the antiferromagnetic layer, a hard magnetic layer may be employed. As the hard magnetic layer, for example, CoPt (Co ranges 50 to 85%), $(Co_xPt_{100-x})_{100-y}Cr_y$ (x is 50 to 85%, y is 0 to 40%), FePt (Pt ranges 40 to 60%) or the like may be employed.

A pinned layer 14 is formed on the pinning layer 13. The pinned layer 14 of the present embodiment is a synthetic pinned layer of a lower pinned layer 14a ($Co_{90}Fe_{10}$ [3 nm]), an Ru layer 14b, and an upper pinned layer 14c ($Fe_{50}Co_{50}$ [3 nm]). The pinning layer (PtMn) 13 and the lower pinned layer 14a just above the layer 13 are exchange-coupled so as to have unidirectional anisotropy. The lower pinned layer 14a and the upper pinned layer 14c above and below the Ru layer 14b are magnetically coupled so strongly that their magnetization directions are anti-parallel to each other.

It is preferable that the lower pinned layer 14a is designed such that the magnetic thickness, that is, saturation magnetization Bs multiplied by the thickness t (Bs*t product) is substantially equal to that of the upper pinned layer 14c. In the present embodiment, the upper pinned layer 14c is $Fe_{50}Co_{50}$[3 nm] and the saturation magnetization of FeCo is approximately 2.2 T, and thus, the magnetic thickness becomes 2.2 T×3 nm=6.6 T nm. Since the saturation magnetization of $Co_{90}Fe_{10}$ of the lower pinned layer 14a is approximately 1.8 T, the thickness t of the lower pinned layer 14a that gives the same magnetic thickness as the above becomes 6.6 T nm/1.8 T=3.66 nm. In the present embodiment, $Co_{90}Fe_{10}$ having a thickness of 3.6 nm is used. From the viewpoints of unidirectional anisotropy field intensity by the pinning layer (PtMn) and antiferromagnetic coupling field intensity of the lower pinned layer and the upper pinned layer via Ru, the thickness of the magnetic layer used for the lower pinned layer is preferably around 2 to 10 nm. If the thickness is too large, it becomes difficult to attain the unidirectional anisotropy field enough for device operations.

As the material of the lower pinned layer 14a, $Co_x^{Fe}{}_{100-x}{}^{alloy}$ (x is 0 to 100%), $Ni_xFe_{100-x}{}^{alloy}$ (x is 0 to 100%), or a material obtained by adding a nonmagnetic element to them may be employed.

The Ru layer 14b has a function of causing antiferromagnetic coupling in the upper and lower magnetic layers to form a synthetic pinned structure. Preferably, the thickness of the Ru layer 14b is 0.8 to 1 nm. A material other than Ru may be employed as long as the material causes sufficient antiferromagnetic coupling to the upper and lower magnetic layers.

The upper pinned layer 14c ($Fe_{50}Co_{50}$ [3 nm]) is a magnetic layer for injecting spin information to the other magnetic layer to be described later, and is a functional layer that plays an extremely important role in the present invention. In particular, the magnetic material positioned on the interface with the spacer layer is important in the point of contributing to spin-dependent interfacial scattering. In the present embodiment, $Fe_{50}Co_{50}$ having a bcc structure is employed.

Examples of the FeCo-based alloy having a bcc structure include $Fe_xCo_{100-x}$ (x is 30 to 100%), or $Fe_xCo_{100-x}$ added with an additional element. Specifically, $Fe_{80}Co_{20}$ which provides a more stable bcc structure may be used as a preferable material. It is preferable that the thickness of the magnetic material functions as the upper pinned layer is 2 nm or more. For the upper pinned layer, CoFe alloy of an fcc structure, or cobalt alloy having an hcp structure may also be used in place of the magnetic material having a bcc structure. All of elemental metals such as Co, Fe and Ni, and an alloy material including any one of these elements may be employed.

As the upper pinned layer, one having magnetic layers (FeCo layers) and nonmagnetic layers (ultrathin Cu layers) stacked alternately may be employed. Preferably, the thickness of the Cu layer between magnetic layers is around 0.1 to 0.5 nm. If the thickness of the Cu layer is too large, the magnetic coupling of the upper and lower magnetic layers via the nonmagnetic Cu layer becomes weak, and the characteristics of the pinned layer become insufficient, which is not preferable. As the material of the nonmagnetic layer between the magnetic layers, Hf, Zr, Ti or the like may be employed in place of Cu. On the other hand, the magnetic layer such as FeCo should preferably have a thickness of 0.5 to 2 nm per one layer.

In place of the upper pinned layer having FeCo layers and Cu layers stacked alternately, an upper pinned layer of an alloy of FeCo and Cu may be used. Examples of such an FeCoCu alloy include $(Fe_x^{Co}{}_{100-x})_{100-y}{}^{Cu}{}_y$ (x is 30 to 100%, and y is 3 to 15%), but the other composition range may be used as well. As the element to be added to FeCo, other elements than Cu, such as Hf, Zr or Ti may be used. A single layer film made of Co, Fe, Ni, or an alloy thereof may be used for the upper pinned layer. For example, a $Co_{90}Fe_{10}$ single layer may be used as the upper pinned layer having the simplest structure. An additional element may be added to these materials.

The thickness of the pinned layer is set such that the pinned magnetic field can be made a sufficiently large value, and sufficiently shorter than the spin diffusion length. Although the spin diffusion length varies with magnetic materials, a typical spin diffusion length is approximately 100 nm, and thus, the thickness of the pinned layer does not exceed 100 nm.

Next, a Cu layer as a first metal layer to become a source of current paths 22 of a spacer layer 16 is deposited on the pinned layer 14, and then an AlCu layer is deposited as a second metal layer to be converted into an insulation layer 21 of the spacer layer 16. Then, ion beam of rare gas is applied to the AlCu layer as the second metal layer, by which pre-ion treatment before oxidization (PIT) is performed. In this process, Ar ion is applied under conditions of acceleration voltage of 30 to 130 V, beam current of 20 to 200 mA, and process time of 30 to 180 seconds. Although the deposited first metal layer (Cu layer) is present in a form of a two-dimensional film, Cu of the first metal layer is sucked and penetrates into the AlCu layer by the PIT process, and the Cu entering the AlCu layer becomes current paths. Further, ion beam-assisted oxidization (IAO) of the AlCu layer as the second metal layer is performed. In this process, while supplying oxygen, Ar ion is applied under conditions of acceleration voltage of 40 to 200 V, beam current of 30 to 300 mA, and process time of 15 to 300 seconds. Al is likely to be oxidized, but Cu is unlikely to be oxidized. Consequently, the spacer layer 16 having the insulation layer 21 made of $Al_2O_3$ and the current paths 22 made of Cu is formed.

The thickness of the Cu layer is adjusted depending on the thickness of the AlCu layer. Namely, as the thickness of the AlCu layer is made larger, the amount of Cu to be made to enter the AlCu layer in the PIT process must be increased, which makes it necessary to make larger the thickness of the Cu layer. For example, when the thickness of the AlCu layer is 0.6 to 0.8 nm, the thickness of the Cu layer is set to around 0.1 to 0.5 nm. When the thickness of the AlCu layer is 0.8 to 1 nm, the thickness of the Cu layer is set to around 0.3 to 1 nm. If the thickness of the Cu layer is too small, the sufficient amount of Cu is not supplied into the AlCu layer at the PIT process, and thus, it becomes impossible to allow current paths of Cu to pass through up to the upper portion of the AlCu layer. On the other hand, if the thickness of the Cu layer is too large, the sufficient amount of Cu is supplied into the AlCu layer at the PIT process, but a thick Cu layer remains eventually between the pinned layer 14 and the spacer layer 16. In order to make the most of the effects of the present invention, it is necessary for the current confined at the spacer layer 16 to reach the magnetic layer while being confined. However, if the thick Cu layer remains between the pinned layer 14 and the spacer layer 16, the current that is confined at the spacer layer 16 widens until it reaches the magnetic layer, which is not preferable.

The material of the first metal layer to form current paths may be Au, Ag or the like, in place of Cu. However, in comparison with Au and Ag, Cu is preferable because it has higher stability to heat treatment. In place of these nonmagnetic materials, magnetic materials may be employed as the material of the first metal layer. Examples of the magnetic materials include Co, Fe, Ni and their alloy. When the magnetic material to be used for the pinned layer and the magnetic material to be used for current paths are same, it is unnecessary to form the source of current paths (first metal layer) on the pinned layer. Namely, after the second metal layer to be converted into the insulation layer is deposited on the pinned layer, PIT process is performed, so that the material of the pinned layer is made to enter the second metal layer, and current paths made of magnetic materials can be formed. When nanoscopic current paths are formed of magnetic materials such as Fe, Co and Ni, and magnetic alloy material including these magnetic elements without using a nonmagnetic layer such as Cu as the spacer layer material, oscillation characteristics or the like are changed, which is preferable to some applications. In this case, the first metal layer may be formed of Fe, Co, Ni, or magnetic alloy material including these magnetic elements, or a new layer is not formed as the first metal layer and the pinned layer 14 may be used as the material for forming nanoscopic current paths as it is.

When $Al_{90}Cu_{10}$ is used as the second metal layer, not only Cu of the first metal layer is sucked up during PIT process, but also Cu in AlCu is separated from Al and becomes current paths. Moreover, if ion beam assist oxidization is performed after PIT process, the separation of Al and Cu is facilitated while oxidization is progressed owing to the assist effect by ion beam. As the second metal layer, Al not including Cu may be used as a current path material in place of $Al_{90}Cu_{10}$. In this case, Cu as the current path material is supplied from only the underlying first metal layer. When AlCu is used as the second metal layer, Cu as the current path material is supplied also from the second metal layer during PIT process. For this reason, it is possible to easily form current paths even in the case where a thick insulation layer is formed. When Al is used as the second metal layer, Cu is hard to be mixed in $Al_2O_3$ formed by oxidization, and thus, it is easy to form $Al_2O_3$ with high resistance.

The thickness of the second metal layer is 0.6 to 2 nm in the case of AlCu, and around 0.5 to 1.7 nm in the case of Al. The thickness of an insulation layer that is formed by these second metal layers being oxidized is around 0.8 to 3.5 nm. An insulation layer whose thickness after oxidization is in the range from 1.3 to 2.5 nm can be manufactured easily, and is advantageous from the point of current confinement effect as well. Further, the diameter of the current path that passes through the insulation layer is around 1 to 10 nm.

It is preferable that AlCu as the second metal layer has a composition expressed by $Al_xCu_{100-x}$ (x is 100 to 70%). An additional element selected from Ti, Hf, Zr, Nb, Mg, Mo, and Si may be added to AlCu. In this case, the composition of the additional element is preferably around 2 to 30%. When the additional element is added, the formation of a CCP structure becomes easy in some cases. In addition, when the additional element distributes more richly in the boundary area between the $Al_2O_3$ insulation layer and the Cu current paths than in other regions, the adhesiveness between the insulation layer and the current paths is improved and electromigration resistance is improved. In the CCP-CPP element, the current density in the spacer layer becomes $10^7$ to $10^{10}$ A/cm$^2$. For this reason, it is important that electromigration resistance is high, and that stability of Cu current paths during a current is supplied can be secured. In the present embodiment, it is preferable to use current density of $10^8$ A/cm$^2$ or higher. However, if an appropriate CCP structure is formed, sufficiently good electromigration resistance can be attained even without adding an additional element to the second metal layer.

The material of the second metal layer is not limited to the Al alloy for forming $Al_2O_3$, but an alloy mainly made of Hf, Zr, Ti, Ta, Mo, W, Nb, Si, Mg or the like may be employed. Further, the insulation layer that is converted from the second metal layer is not limited to an oxide, but a nitride or an oxynitride may be used. In the case of using any material as the second metal layer, it is preferable that the thickness when deposited is 0.5 to 2 nm, and that the thickness when converted into an oxide, a nitride, or an oxynitride is 0.8 to 3.5 nm.

On the spacer layer 16, a film of Cu [0.25 nm] is deposited as a metal layer 17. The metal layer 17 has a function as a barrier layer that prevents a free layer to be deposited thereon from contacting with the oxide of the spacer layer 16 and being oxidized. Incidentally, in some cases, oxidization of the free layer can be avoided through optimization of anneal conditions or the like. Accordingly, the metal layer 17 on the spacer layer 16 is not necessarily provided. Thus, while the metal layer 15 under the spacer layer 16 which is the source of current paths is necessary, the metal layer 17 on the spacer layer 16 is not always necessary. Taking production margin into consideration, it is preferable to form the metal layer 17 on the spacer layer 16. Examples of the material of the metal layer 17 include Au, Ag, and Ru as well as Cu. However, the material of the metal layer 17 is preferably same as the material of current paths in the spacer layer 16. If a material different from the material of current paths is used as the material of the metal layer 17, interface resistance increases, but when both the materials are same, interface resistance does not increase. The thickness of the metal layer 17 is preferably 0 to 1 nm, and more preferably 0.1 to 0.5 nm. If the metal layer 17 is too thick, the current that is confined at the spacer layer 16 spreads at the metal layer 17, so that the current confinement effect becomes insufficient.

On the metal layer 17, a film of $Co_{90}Fe_{10}$ [1 nm]/$Ni_{83}Fe_{17}$ [3.5 nm] is deposited as a second magnetic layer 18. In the case of using a CoFe alloy near $Co_{90}Fe_{10}$, the thickness is preferably set to 0.5 to 4 nm. In the case of using a CoFe alloy of another composition (for example, the composition described in connection with the pinned layer), the thickness is preferably set to 0.5 to 2 nm. In the case of using Fe not including Co, the thickness can be set around 0.5 to 4 nm since soft magnetic characteristics are relatively good. The composition of a NiFe alloy is preferably $Ni_xFe_{100-x}$ (x is 78 to 85%). The thickness of the NiFe layer is preferably set to around 2 to 5 nm. In the case where no NiFe layer is used, a free layer may be used in which CoFe layers or Fe layers of 1 to 2 nm and ultrathin Cu layers of about 0.1 to 0.8 nm are stacked alternately.

On the free layer 18, Cu [1 nm] and Ru [10 nm] are stacked as a cap layer 19. The cap layer 19 has a function of protecting the spin valve film. It is preferable that the thickness of the Cu layer is around 0.5 to 10 nm. The Ru layer having a thickness around 0.5 to 10 nm may be provided directly on the free layer 18 without providing the Cu layer. In place of the Ru layer, another metal layer may be provided on the Cu layer. The structure of the cap layer is not particularly limited, and other materials may be used as long as they exert a cap effect. An upper electrode 20 for allowing current to flow perpendicularly to the spin valve film is formed on the cap layer 19.

In the CCP-CPP oscillator according to the present embodiment, oscillation occurs efficiently, but magnetization reversal is unlikely to occur. Further, in the CCP-CPP oscillator according to the present embodiment, the regions where spin wave excitation occurs efficiently (refer to FIG. 3) can be changed greatly by changing the area ratio of nanoscopic current paths in the plane. Accordingly, the oscillation frequencies can be changed in a very wide range of 1 GHz to several hundreds of GHz. Further, in the CCP-CPP oscillator according to the present embodiment, high Q values of 200 or more can be obtained.

Embodiment 2

Figure 8:
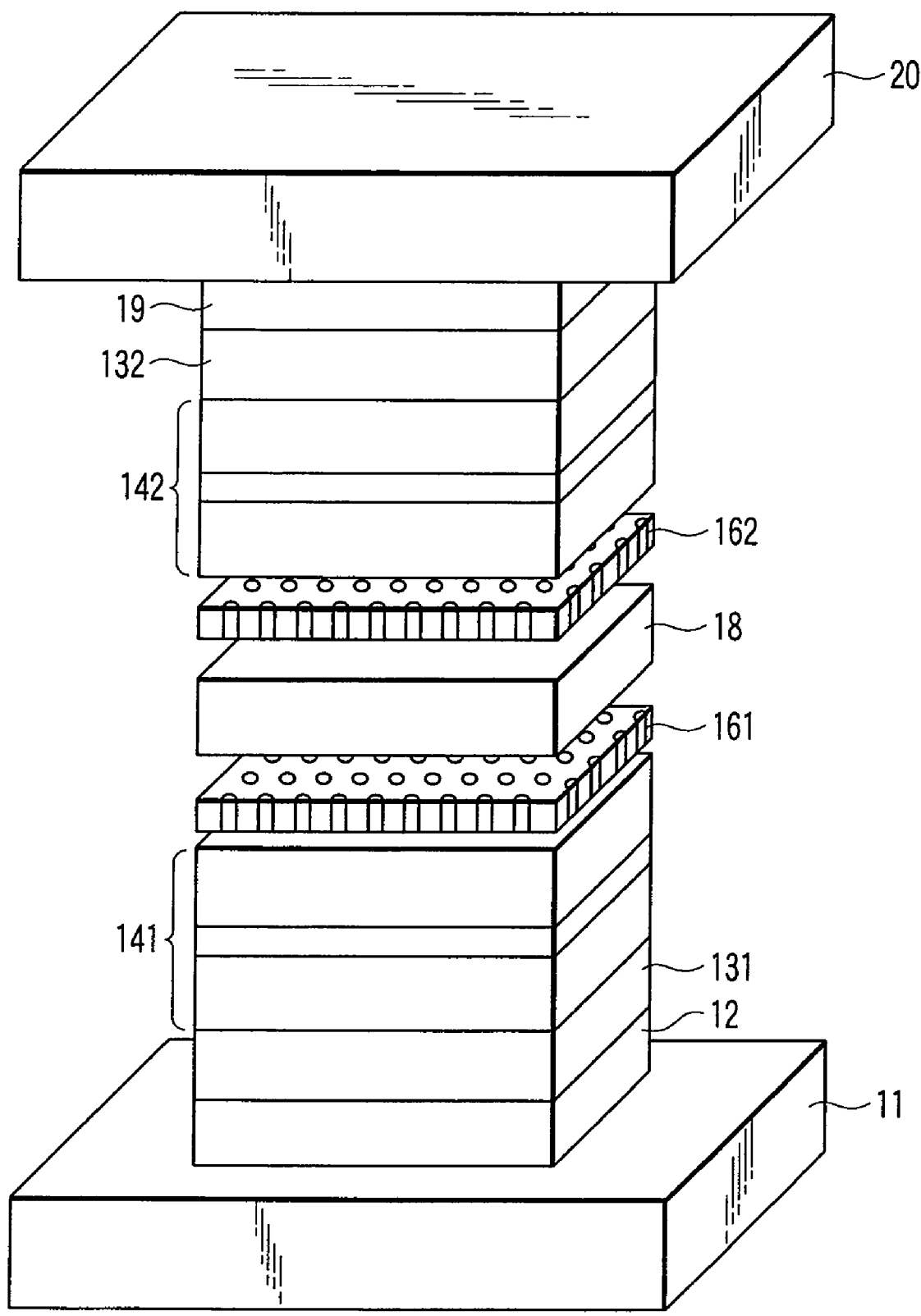
FIG. 8 is a perspective view of a CCP-CPP oscillator according to Embodiment 2.

FIG. 8 shows a perspective view of a CCP-CPP oscillator according to a modified example of the present invention. The CCP-CPP oscillator has a structure in which stacked on a substrate (not shown) are a lower electrode 11, an underlayer 12, a first pinning layer 131, a first magnetization pinned layer (synthetic pinned layer) 141, a first intermediate layer 161, an oscillation layer 18, a second intermediate layer 162, a second magnetization pinned layer (synthetic pinned layer) 142, a second pinning layer 132, a cap layer 19, and an upper electrode 20.

In this CCP-CPP oscillator, the intermediate layers 161, 162 including nanoscopic current paths are provided on and under an oscillation layer 18 where spin waves are excited, and an oscillation output can be increased since the current confinement effect is high.

Embodiment 3

Figure 9:
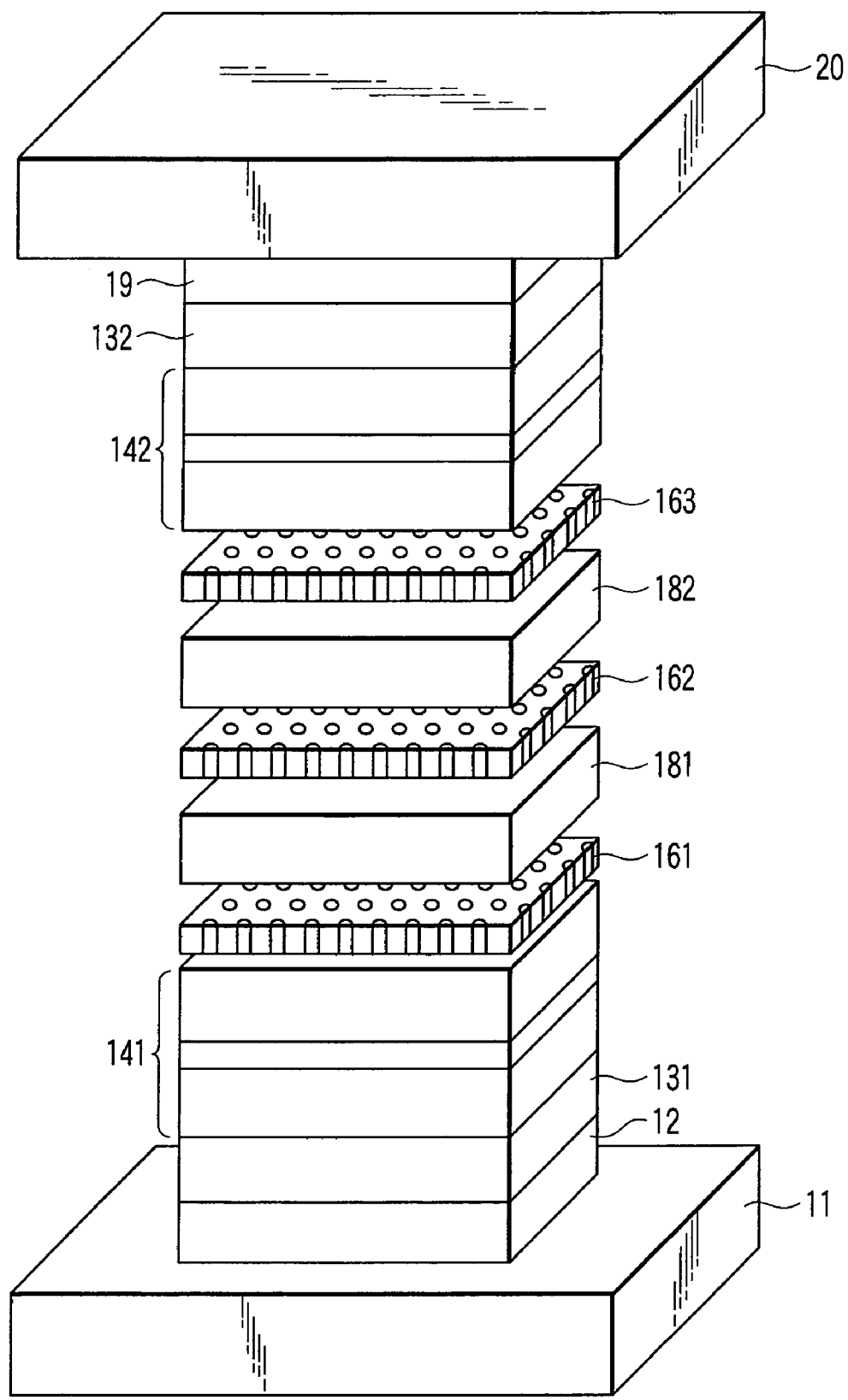
FIG. 9 is a perspective view of a CCP-CPP oscillator according to Embodiment 3.

FIG. 9 shows a perspective view of a CCP-CPP oscillator according to another modified example of the present invention. The CCP-CPP oscillator has a structure in which stacked on a substrate (not shown) are a lower electrode 11, an underlayer 12, a first pinning layer 131, a first magnetization pinned layer (synthetic pinned layer) 141, a first intermediate layer 161, a first oscillation layer 181, a second intermediate layer 162, a second oscillation layer 182, a third intermediate layer 163, a second magnetization pinned layer (synthetic pinned layer) 142, a second pinning layer 132, a cap layer 19, and an upper electrode 20.

Since this CCP-CPP oscillator includes two layers of the oscillation layer similar to that in FIG. 8, an oscillation output can be increased.

Embodiment 4

Figure 10A:
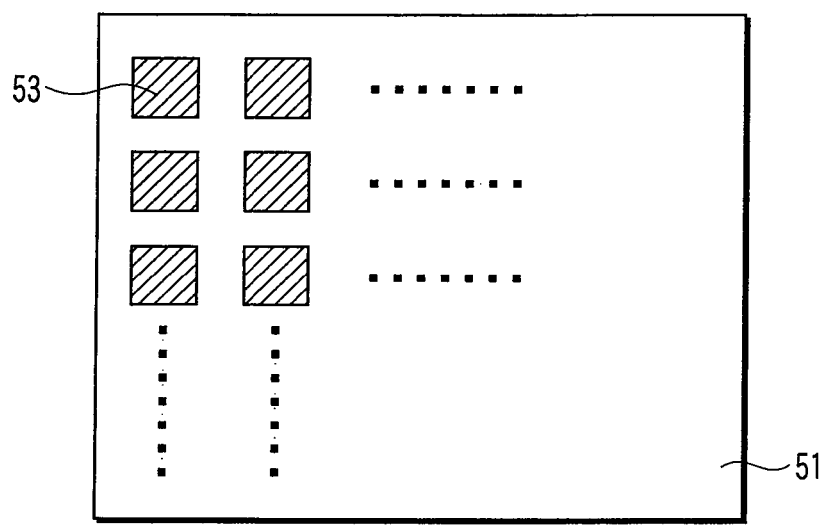
FIGS. 10A and 10B are a plan view of a high-frequency integrated circuit according to Embodiment 4, and a view showing a stacked structure thereof.
Figure 10B:
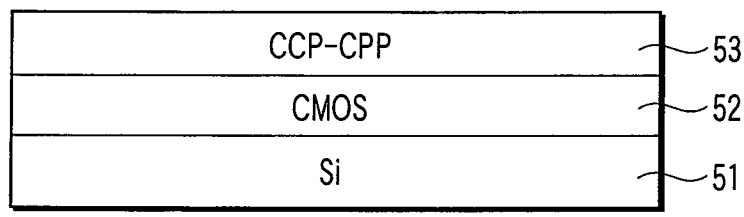

In this example, description will be given to a high-frequency integrated circuit in which high-frequency oscillators are connected in parallel. FIGS. 10A and 10B are a plan view of the high-frequency integrated circuit according to the present example and a view of a stacked structure thereof. As shown in FIG. 10B, a CMOS transistor 52 serving as an amplifier is formed on a Si substrate 51, and on the CMOS transistor 52, a CCP-CPP oscillator 53 is formed. As shown in FIG. 10A, a plurality of CCP-CPP oscillators 53 are regularly arranged on the surface of the Si substrate 51. In general, a CMOS manufacturing process includes a higher temperature step than the process for manufacturing the CCP-CPP oscillator, and thus, a stacked structure as shown in FIG. 10B is employed. Namely, a CMOS transistor 52 is formed on the Si substrate 51, the surface is made flat and a contact is formed thereon, and then, the CCP-CPP oscillators 53 are formed.

Figure 11:
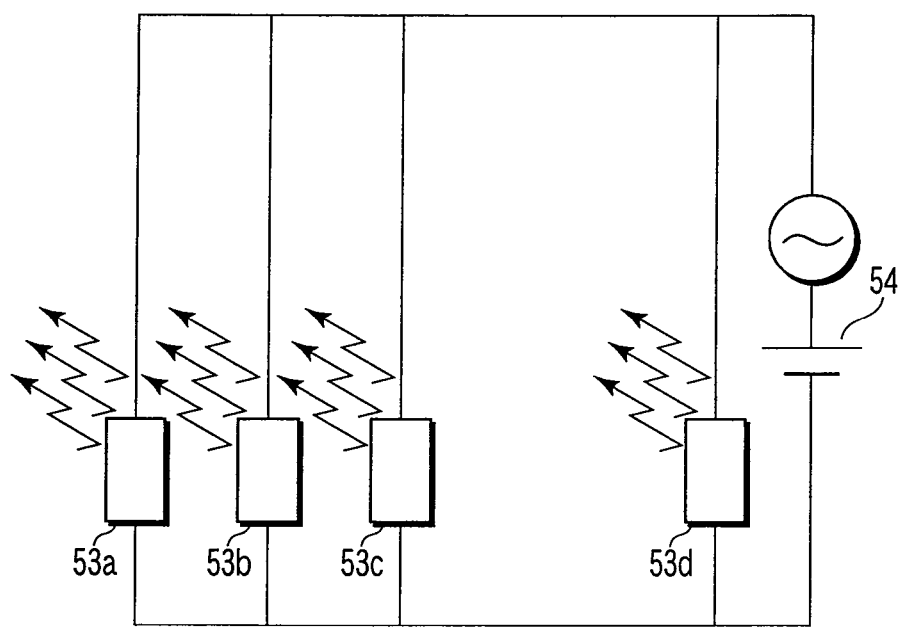
FIG. 11 is a diagram showing a high-frequency integrated circuit connected in parallel according to Embodiment 4.
Figure 12A:
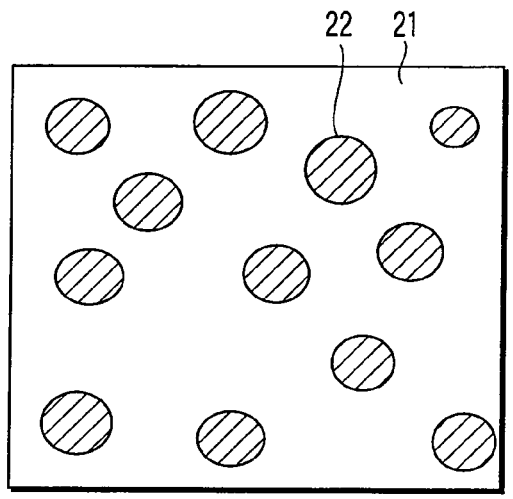
FIGS. 12A, 12B and 12C are schematic views each showing an intermediate layer with different area ratios of current paths of a CCP-CPP oscillator according to Embodiment 4.
Figure 12B:
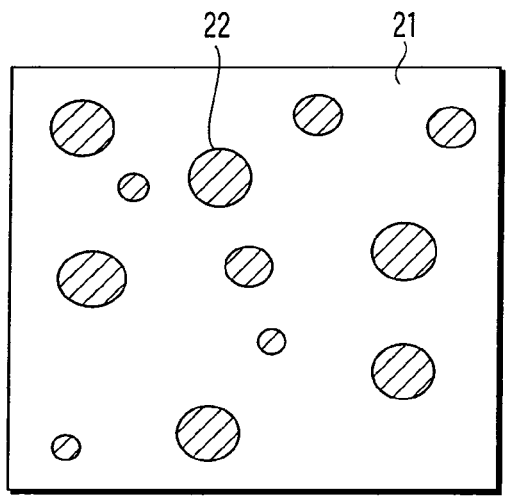
Figure 12C:
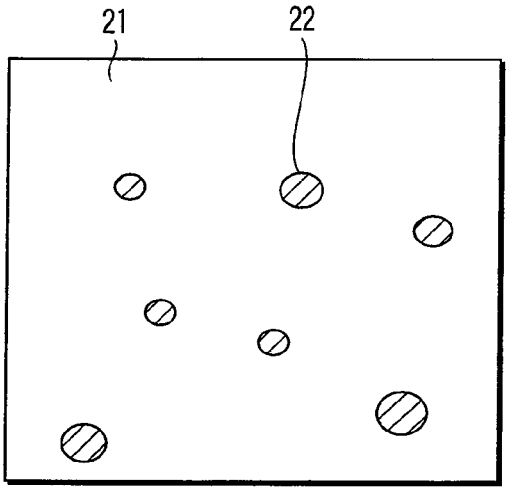

As shown in FIG. 11, a plurality of CCP-CPP oscillators 53a, 53b, 53c and 53d are connected in parallel to a power source 54 to form a high-frequency integrated circuit. As shown in FIGS. 12A, 12B and 12C, these CCP-CPP oscillators have respectively different area ratios of nanoscopic current paths 22 in an intermediate layer including an insulation layer 21 and the nanoscopic current paths 22, and as a result, they have different oscillation frequencies. The area ratios of the nanoscopic current paths 22 in the intermediate layer become smaller in the order of a, b and c.

Figure 13:
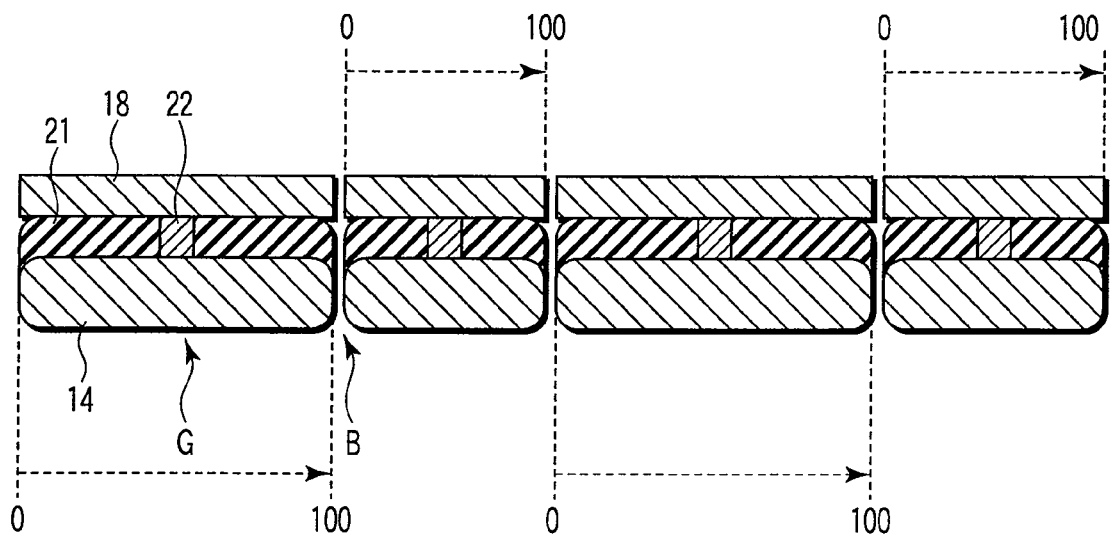
FIG. 13 is a view showing a preferable cross-sectional structure of a magnetization pinned layer, an intermediate layer, and an oscillation layer of the CCP-CPP oscillator according to Embodiment 4.

FIG. 13 shows a preferable cross-sectional structure of a magnetization pinned layer 14, an intermediate layer 16, and an oscillation layer 18. The magnetic pinned layer 14 has a microstructure in which crystal grains G separated by grain boundaries B grow. The intermediate layer 16 includes the insulation layer 21 and the nanoscopic current paths 22, and the nanoscopic current paths 22 pass through the insulation layer 21 in the thickness direction substantially at the center of the crystal grains G. Further, on the intermediate layer 16, the crystal grains of the oscillation layer 18 grow. In such a structure, the regions where the confined current flows are distributed in the magnetic pinned layer or the oscillation layer on and under the nanoscopic current path becomes the center of the crystal grains. The center of the crystal grains has a favorable crystal structure, and is not subject to influences of electron scattering in the crystal grain boundaries, thereby enabling realization of good oscillation characteristics. This makes it possible to realize favorable Q values, and to increase the oscillation output.

Present of the nanoscopic current path at the center portion of the crystal grain means that the following becomes a preferable range when the crystal grain is defined based of observation with a cross-sectional TEM or the like. In each crystal grain in FIG. 13, coordinates are specified such that the left end of the grain boundary of the crystal grain is coordinate 0, the right end is coordinate 100, and the center portion of the crystal grain is coordinate 50. In this case, it is preferable that at least a part of the nanoscopic current path having a crystal structure which passes through the oxide exists in the range from coordinate 20 to 80. More preferably, the entire nanoscopic current path having the crystal structure which passed through the oxide exists in the range from coordinate 20 to 80. Alternatively, it is desired that the nanoscopic current path exists in the inside of a crystal grain 3 nm or more away from the crystal grain boundary (coordinate 0, or coordinate 100).

Here, as the easiest definition method for the crystal grain, one protrusion that forms such unevenness as schematically shown in FIG. 13 may be defined as a crystal grain. In other words, a cycle of the unevenness may be defined as the size of a crystal grain. It is supposed that the unevenness is identified by the unevenness in the interface between the oxide that forms the spacer layer and the lower magnetic layer. The peak portion of the unevenness is the center portion of the crystal grain, and the lower portion corresponds to the grain boundary. In this case, it is necessary to make the film sufficiently thin in the depth direction to be observed by cross-sectional TEM so that the crystal lattice should be clearly observed. Further, not only by the simple unevenness, but also by discontinuation of crystal lattice with an adjacent crystal grain, the crystal grain and gain boundary may also be defined. In other words, the crystal lattice exists substantially continuously in a same crystal grain, and the grain boundary can be confirmed as an interface where continuity of crystal lattice is broken.

As described previously, in the high-frequency integrated circuit according to the present embodiment, the plural high-frequency oscillators connected in parallel have different oscillation frequencies, and can be used in a wide frequency band. If such a function is to be realized in high frequencies such as millimeter waves and microwaves by means of the conventional technique, the system must be large in size and expensive in costs, so that its spread to consumer applications has been prevented. However, by use of the high-frequency integrated circuit according to the present embodiment, it is possible to construct a system at low cost, and spread a high-frequency device handling millimeter waves and microwaves in consumer applications.

It should be noted that a plurality of CCP-CPP oscillators having substantially the same oscillation frequencies may be connected in parallel to form a high-frequency integrated circuit. For the purpose of increasing the oscillation output, such a high-frequency integrated circuit may bring about advantages.

Further, a high-frequency integrated circuit of parallel connection as shown in FIG. 11 may be manufactured by use of a conventional CPP oscillator having an intermediate layer made of a nonmagnetic metal (typically Cu with thickness of several nm), not a CCP-CPP oscillator having an intermediate layer including an insulation layer and current paths. In such a high-frequency integrated circuit, oscillation frequencies of respective CPP oscillators may be changed by providing wires as shown in FIGS. 5 to 7 to apply an external magnetic field.

Embodiment 5

Figure 14:
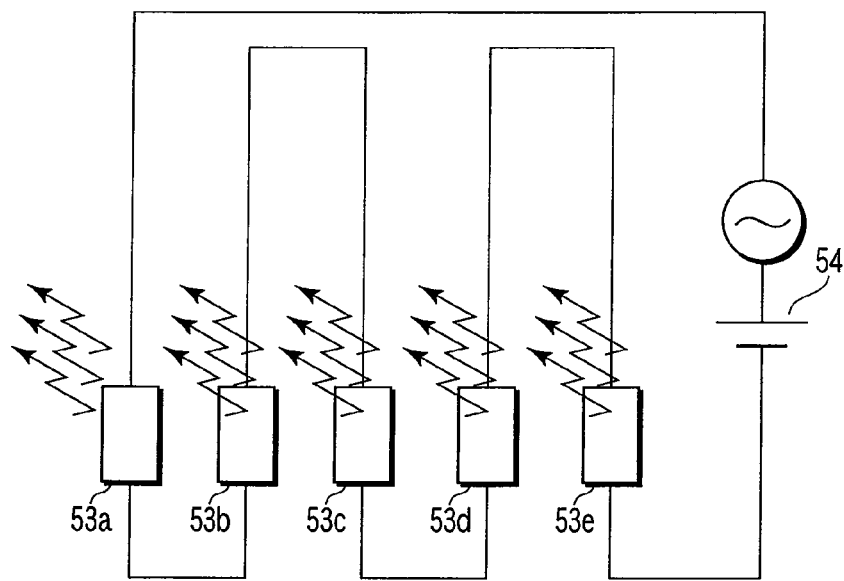
FIG. 14 is a diagram showing a high-frequency integrated circuit connected in series according to Embodiment 5.

In this embodiment, description will be give to a high-frequency integrated circuit in which high-frequency oscillators are connected in series. A plan view and a stacked structure of the high-frequency integrated circuit are same as those shown in FIGS. 10A and 10B. Namely, a CMOS transistor and a CCP-CPP oscillator are formed on a Si substrate, and a plurality of CCP-CPP oscillators 53 are regularly arrayed on the surface of the Si substrate. As shown in FIG. 14, a plurality of CCP-CPP oscillators 53a, 53b, 53c, 53d and 53e are connected in series to a power source 54, by which a high-frequency integrated circuit is formed. By connecting plural CCP-CPP oscillators in series in this manner, the oscillation output can be increased.

In this case as well, a high-frequency integrated circuit of series connection shown in FIG. 14 may be manufactured by use of conventional CPP oscillators, not CCP-CPP oscillators.

Embodiment 6

Figure 15:
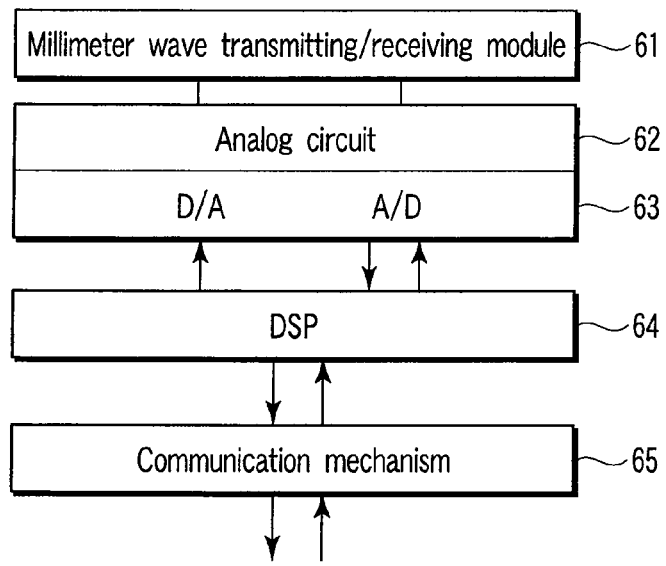
FIG. 15 is a diagram showing a system configuration of an in-vehicle radar of millimeter waveband according to Embodiment 6.

FIG. 15 shows a system configuration of an in-vehicle radar of millimeter wave (or microwave) band using the high-frequency oscillator according to the present embodiment. This system has a millimeter wave transmitting/receiving module 61 having the high-frequency oscillator according to the embodiment, an analog circuit 62 for processing signals of the transmitting/receiving module 61, a converter 63 for performing analog-to-digital conversion and digital-to-analog conversion, a digital signal processor (DSP) 64, and a communication mechanism 65 for performing transmission and reception with the outside.

Figure 16:
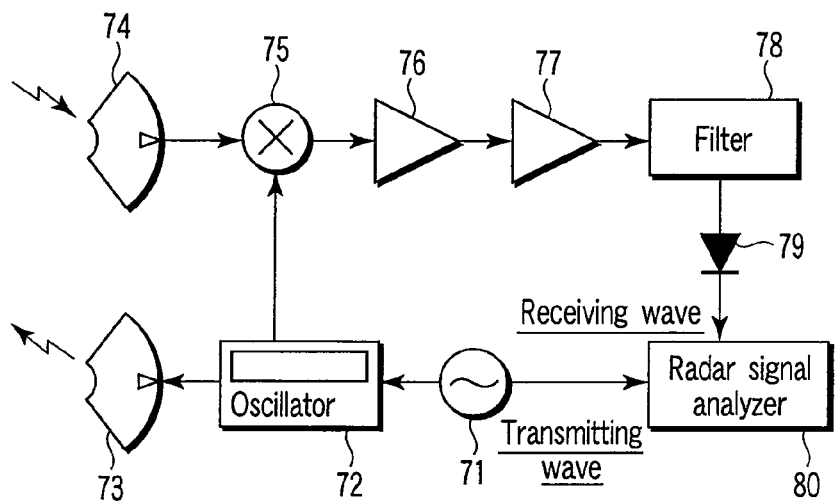
FIG. 16 is a circuit diagram of an in-vehicle radar of an FM-CW radar method.
Figure 17:
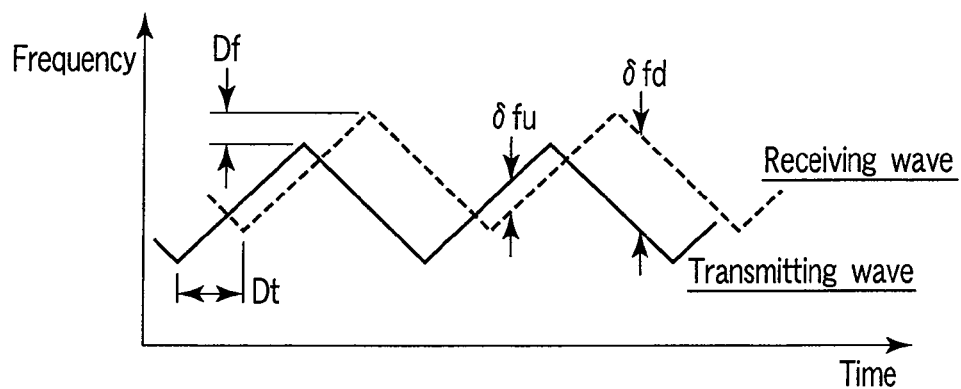
FIG. 17 is a view showing signal waveforms by the radar in FIG. 16.

FIG. 16 shows a more specific circuit diagram of an in-vehicle radar of an FM-CW radar method. FIG. 17 shows signal waveforms by this radar. These signal waveforms suppose the case where the radar approaches a target.

A transmitting wave from a generator 71 and a carrier wave from an oscillator 72 are emitted from a transmitting antenna 73 as an FM modulation wave in proportion with an output voltage. The transmitting wave is transmitted to a radar signal analyzer 80. A receiving wave reflected from a reflective object and received by a receiving antenna 74 and part of the transmitting wave are combined by a mixer 75 to obtain a beat signal. The beat signal is transmitted to the radar signal analyzer 80 via a front amplifier 76, an intermediate frequency amplifier 77, a filter 78, and a wave detector 79.

The beat signal includes phase delay (Dt in FIG. 17) in proportion with a distance to the target and Doppler frequency shift (Df in FIG. 17) occurring from a relative speed with the target. Dt and Df can be calculated from frequency differences (δfu, δfd) of beat signals at modulation frequency increase and decrease. On the basis of the calculated values, the distance to the target and the relative speed can be obtained.

Figure 18:
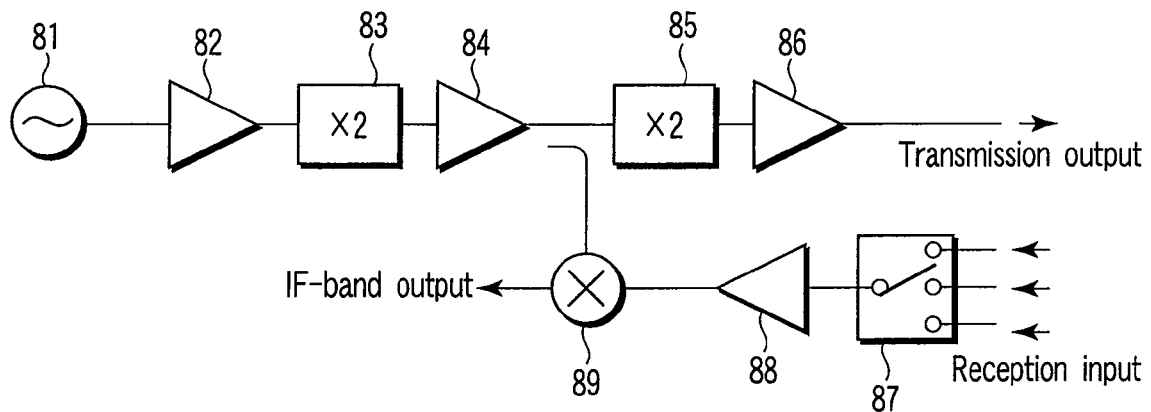
FIG. 18 is a diagram showing an exemplary configuration of a millimeter wave in-vehicle radar of an FM-CW radar method.

FIG. 18 shows an exemplary configuration of a millimeter wave in-vehicle radar of an FM-CW radar method that operates at a specific frequency. At the time of transmitting, a transmission output is emitted via a 19-GHz-band oscillator 81, a 19-GHz-band power amplifier 82, a 19/38-GHz frequency doubler 83, a 38-GHz power amplifier 84, a 38/76-GHz frequency doubler 85, and a 76-GHz-band power amplifier 86. At the time of receiving, a reception input is received by a 76-GHz-band switch 87, and an IF-band output is obtained via a 76-GHz-band low-noise amplifier 88 and a receiving mixer 89.

Figure 19:
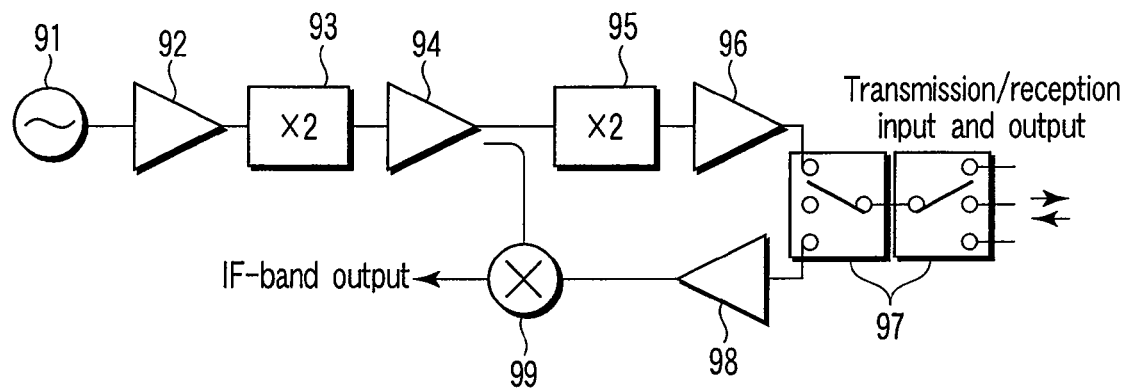
FIG. 19 is a diagram showing an exemplary configuration of a millimeter wave in-vehicle radar of a pulse Doppler method.

FIG. 19 shows an exemplary configuration of a millimeter wave in-vehicle radar of a pulse Doppler method that operates at a specific frequency. At the time of transmitting, a transmission output is emitted via a 19-GHz-band oscillator 91, a 19-GHz-band power amplifier 92, a 19/38-GHz frequency doubler 93, a 38-GHz power amplifier 94, a 38/76-GHz frequency doubler 95, a 76-GHz-band power amplifier 96, and a 76-GHz switch 97. At the time of receiving, a reception input is received by a 76-GHz-band switch 97, and an IF-band output is obtained via a 76-GHz-band low-noise amplifier 98 and a receiving mixer 99.

The high-frequency oscillators as shown in FIG. 1 is employed as the oscillators 81 and 91 in FIGS. 18 and 19, and thus, it is possible to realize an in-vehicle radar that is more compact with a simpler circuit configuration at lower costs than one using the conventional oscillator. The frequency is not limited to the above-described frequency, but in accordance with allocation of available frequencies, the high-frequency oscillator according to the embodiment can operate in a wide frequency range from several tens of GHz to several hundreds of GHz, several THz and the like.

Figure 20:
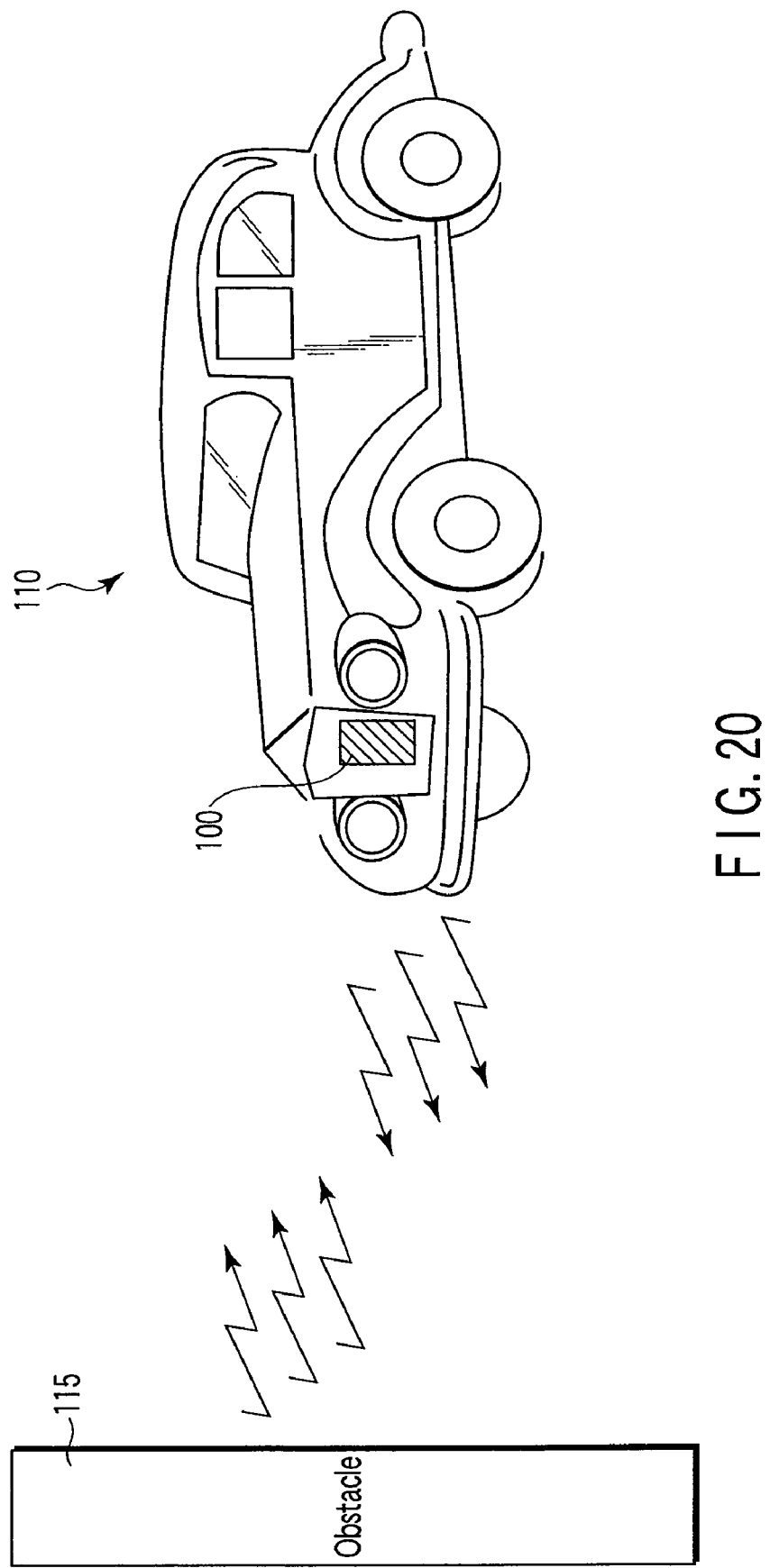
FIG. 20 is a view showing an automobile including the in-vehicle radar device according to Embodiment 6.

FIG. 20 shows an automobile 110 loading an in-vehicle radar device 100 according to the embodiment. With the principle described above, it is possible to obtain a distance from the automobile 110 to an obstacle 115 and the relative speed.

It has been difficult to make compact the conventional in-vehicle radar, and thus its attachment positions are limited. For example, if the conventional in-vehicle radar is attached to a front grill, the position is too low, and it cannot detect well the position of a truck or the like. In contrast, the in-vehicle radar according to the embodiment can be made compact, and therefore, it can be attached to an arbitrary position without limited to the radiator grill or hood. For this reason, the in-vehicle radar according to the embodiment may be also attached to low-end cars.

Embodiment 7

FIG. 21 shows a vehicle-to-vehicle communication apparatus according to the embodiment. An in-vehicle radar device 100 including the CCP-CPP oscillator according to the embodiment is attached to each of the front and rear portions of each automobile 110. In this apparatus, bi-directional communication is performed between the automobiles 110, and the automobiles are controlled so as to run keeping a constant distance therebetween, so that an intelligent transport system (ITS) can be realized.

Since a transmitting/receiving apparatus according to the embodiment can be made compact, the degree of freedom of its attachment position is very large, and a protective structure to avoid wind, rain and snow can be greatly simplified, which makes it possible to lower its price.

Embodiment 8

FIG. 22 shows an information terminal-to-terminal communication apparatus according to the example. A transmitting/receiving apparatus 105 including the CCP-CPP oscillator according to the invention is attached to each portable information terminal 120, whereby bi-directional simple near-field communication can be performed. Since high frequencies are used, the information amount is large, and near-field high-speed radio data communication is very convenient.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high-frequency oscillator, comprising:
a high-frequency oscillation element comprising a magnetization pinned layer whose magnetization direction is pinned substantially in one direction, an oscillation layer formed of a magnetic material which generates a high-frequency oscillation phenomenon when a current is supplied, an intermediate layer provided between the magnetization pinned layer and the oscillation layer, and a pair of electrodes which supply a current perpendicularly to a plane of a stacked film including the magnetization pinned layer, the intermediate layer and the oscillation layer; hard bias layers arranged on both sides of the stacked film; and a magnetic field application mechanism which applies a magnetic field to the stacked film, wherein the intermediate layer comprises an insulation layer and current paths which pass through the insulation layer in a thickness direction.

2. The oscillator according to claim 1, wherein the insulating layer is an oxide, a nitride or an oxynitride containing at least one element selected from the group consisting of Al, Hf, Zr, Ti, Ta, Mo, W, Nb and Si.

3. The oscillator according to claim 1, wherein the intermediate layer comprises a nonmagnetic metal.

4. The oscillator according to claim 1, wherein the magnetic field application mechanism applies a magnetic field with a wire arranged parallel to the direction of the current supplied to the stacked film.

5. The oscillator according to claim 1, wherein the magnetic field application mechanism applies a magnetic field with a wire arranged perpendicular to the direction of the current supplied to the stacked film.

6. A high-frequency oscillator, comprising:
a high-frequency oscillation element comprising a first magnetization pinned layer whose magnetization direction is pinned substantially in one direction;
an oscillation layer formed of a magnetic layer which generates a magnetic oscillation phenomenon when a current is supplied;
a second magnetization pinned layer whose magnetization direction is pinned substantially in one direction;
a first intermediate layer provided between the first magnetization pinned layer and the oscillation layer, the first intermediate layer having an insulation layer and current paths which passed through the insulation layer in a thickness direction;
a second intermediate layer provided between the oscillation layer and the second magnetization pinned layer, the second intermediate layer having an insulation layer and current paths which pass through the insulation layer in a thickness direction;
a pair of electrodes which supply a current perpendicularly to a plane of a stacked film including the first magnetization pinned layer, the first intermediate layer, the oscillation layer, the second magnetization pinned layer, and the second intermediate layer;
hard bias layers arranged on both sides of the stacked film; and
a magnetic field application mechanism which applies a magnetic field to the stacked film.

7. The oscillator according to claim 6, further comprising a plurality of the high-frequency oscillation elements, wherein the elements have different area ratios of the current paths in the first and second intermediate layers and different oscillation frequencies.

* * * * *